United States Patent
Xie et al.

(10) Patent No.: US 11,990,412 B2
(45) Date of Patent: May 21, 2024

(54) BURIED POWER RAILS LOCATED IN A BASE LAYER INCLUDING FIRST, SECOND, AND THIRD ETCH STOP LAYERS

(71) Applicant: INTERNATIONAL BUSINESS MACHINES CORPORATION, Armonk, NY (US)

(72) Inventors: Ruilong Xie, Niskayuna, NY (US); Stuart Sieg, Albany, NY (US); Somnath Ghosh, Clifton Park, NY (US); Kisik Choi, Watervliet, NY (US); Rishikesh Krishnan, Cohoes, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 185 days.

(21) Appl. No.: 17/488,389

(22) Filed: Sep. 29, 2021

(65) Prior Publication Data

US 2023/0100113 A1    Mar. 30, 2023

(51) Int. Cl.
*H01L 23/528* (2006.01)
*H01L 21/311* (2006.01)
(Continued)

(52) U.S. Cl.
CPC .... *H01L 23/5286* (2013.01); *H01L 21/31116* (2013.01); *H01L 21/76816* (2013.01);
(Continued)

(58) Field of Classification Search
CPC ............. H01L 23/5286; H01L 23/5226; H01L 23/5283; H01L 21/31116; H01L 21/76816; H01L 21/76829; H01L 21/823871; H01L 21/76895; H01L 21/76897; H01L 21/76898; H01L 27/092; H01L 29/0665; H01L 29/42392
See application file for complete search history.

(56) References Cited

U.S. PATENT DOCUMENTS 6,670,716 B2    12/2003  Christensen et al.
9,570,395 B1     2/2017  Sengupta et al.
(Continued)

FOREIGN PATENT DOCUMENTS

CN    101127351 A    2/2008
EP      3671858 A1    6/2020

OTHER PUBLICATIONS

International Search Report issued in corresponding PCT Application Serial No. PCT/EP2022/076762 dated Jan. 30, 2023, 4 pgs.

*Primary Examiner* — Shahed Ahmed
*Assistant Examiner* — Vicki B. Booker
(74) *Attorney, Agent, or Firm* — Tutunjian & Bitetto, P.C.; Samuel Waldbaum (57) ABSTRACT

Integrated chips and methods of forming the same include forming a stack of layers, including a device stack above a first sacrificial layer, above a substrate. The first sacrificial layer is replaced with a first etch stop layer. The substrate is removed, exposing a substrate-side of the stack of layers. The substrate-side of the stack of layers is etched to form a trench, stopping on the first etch stop layer. A conductive line is formed in the trench.

6 Claims, 9 Drawing Sheets

(51) Int. Cl.
*H01L 21/768* (2006.01)
*H01L 21/8238* (2006.01)
*H01L 23/522* (2006.01)
*H01L 27/092* (2006.01)
*H01L 29/06* (2006.01)
*H01L 29/423* (2006.01)

(52) U.S. Cl.
CPC .... *H01L 21/76829* (2013.01); *H01L 23/5226* (2013.01); *H01L 23/5283* (2013.01); *H01L 21/823871* (2013.01); *H01L 27/092* (2013.01); *H01L 29/0665* (2013.01); *H01L 29/42392* (2013.01)

(56) References Cited

U.S. PATENT DOCUMENTS

| | | |
|---|---|---|
| 10,586,765 B2 | 3/2020 | Smith et al. |
| 10,636,739 B2 | 4/2020 | Beyne et al. |
| 10,685,865 B2 | 6/2020 | Sung et al. |
| 10,700,207 B2 | 6/2020 | Chen et al. |
| 10,886,224 B2 | 1/2021 | Gerousis et al. |
| 11,004,855 B2 | 5/2021 | Wang et al. |
| 11,387,181 B2 * | 7/2022 | Chou .............. H01L 21/823475 |
| 2017/0294448 A1 * | 10/2017 | Debacker .......... H01L 27/11807 |
| 2020/0105671 A1 | 4/2020 | Lai et al. |
| 2020/0135634 A1 | 4/2020 | Chiang et al. |
| 2020/0203276 A1 | 6/2020 | Hiblot et al. |
| 2020/0219813 A1 | 7/2020 | Paul et al. |
| 2020/0266169 A1 * | 8/2020 | Kang ................ H01L 21/76877 |
| 2020/0373242 A1 | 11/2020 | Hiblot et al. |
| 2020/0411436 A1 * | 12/2020 | Xie ................... H01L 21/76877 |
| 2021/0098294 A1 | 4/2021 | Smith et al. |
| 2021/0134721 A1 | 5/2021 | Chiang et al. |
| 2022/0157723 A1 * | 5/2022 | Park ..................... H01L 23/535 |
| 2022/0181258 A1 * | 6/2022 | Liebmann ......... H01L 29/66742 |

* cited by examiner

BURIED POWER RAILS LOCATED IN A BASE LAYER INCLUDING FIRST, SECOND, AND THIRD ETCH STOP LAYERS

BACKGROUND

The present invention generally relates to integrated chip manufacturing, and more particularly, to the fabrication of integrated chips with backside power rails and backside power distribution networks.

Burying power rails in the substrate underneath chip devices help to organize power and routing for small-scale devices, and make it possible to use backside power distribution networks. However, as devices are scaled down in size and placed close to one another, forming buried power rails between cell spaces becomes challenging.

SUMMARY

A method of forming an integrated chip includes forming a stack of layers, including a device stack above a first sacrificial layer, above a substrate. The first sacrificial layer is replaced with a first etch stop layer. The substrate is removed, exposing a substrate-side of the stack of layers. The substrate-side of the stack of layers is etched to form a trench, stopping on the first etch stop layer. A conductive line is formed in the trench.

An integrated chip includes a frontside device above a substrate, having a channel and source/drain structures. A buried power rail is in the substrate, underneath the frontside device. A first etch stop layer is between the buried power rail and the frontside device. An electrical contact penetrates the substrate to make an electrical connection between the buried power rail and the frontside device.

An integrated chip includes frontside devices above a substrate, each having a channel and source/drain structures, and having an inter-device distance between an adjacent pair of frontside devices. A buried power rail is in the substrate, underneath the pair of frontside devices, having a width that is greater than the inter-device distance. An electrical contact penetrates the substrate to make an electrical connection between the buried power rail and the frontside device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Buried power rails can be used to connect to a backside power distribution network, where power is supplied to device components by interconnects that are formed underneath the device components. Rather than using a process that carefully controls the thickness of the substrate, the substrate may be removed entirely, using etch stop features that prevent over-etching of the backside power rail which shorts to device regions in the frontside of the wafer. Backside power rails may then be formed in the backside of the wafer, with electrical contact being made to a device region of the frontside devices, using etch stop features embedded in the fins to control the formation of such power rails.

Figure 1:
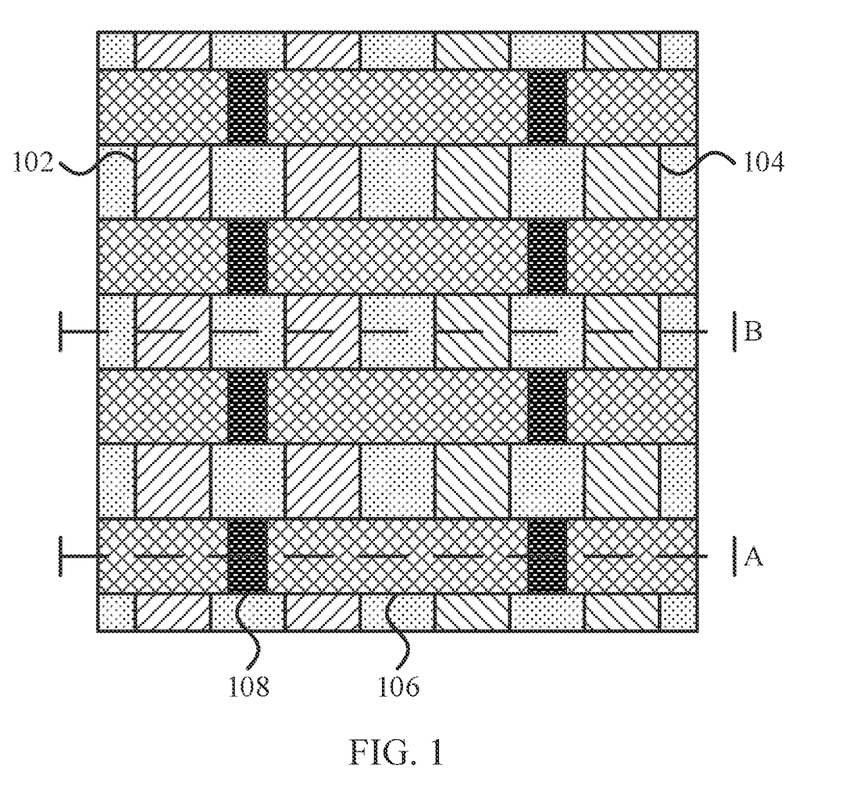
FIG. 1 is a top-down view of an integrated chip having a plurality of transistor devices, including n-type devices and p-type devices, in accordance with an embodiment of the present invention.

Referring now to the drawings in which like numerals represent the same or similar elements and initially to FIG. 1, a top-down view of an integrated chip is shown. This view shows a set of nanosheets, each corresponding to exemplary semiconductor devices. For example, the nanosheets may include p-type nanosheet field effect transistors 102 and n-type nanosheet field effect transistor 104. Gate structures 106 are formed across the nanosheets 102 and 104, being cut into appropriate sections by gate cuts 108.

Two cross-sections are indicated and will be referred to herein, with a first cross-section A showing a region of the fins that cuts through the gate and channel region, and a second cross-section B showing a region of the fins that cuts through a source/drain region. Although the present embodiments are described with particular focus on nanosheet devices, it should be understood that the present principles may also be applied to other types of devices, such as nanowire transistors, fin field effect transistors, planar devices, and so on.

Figure 2:
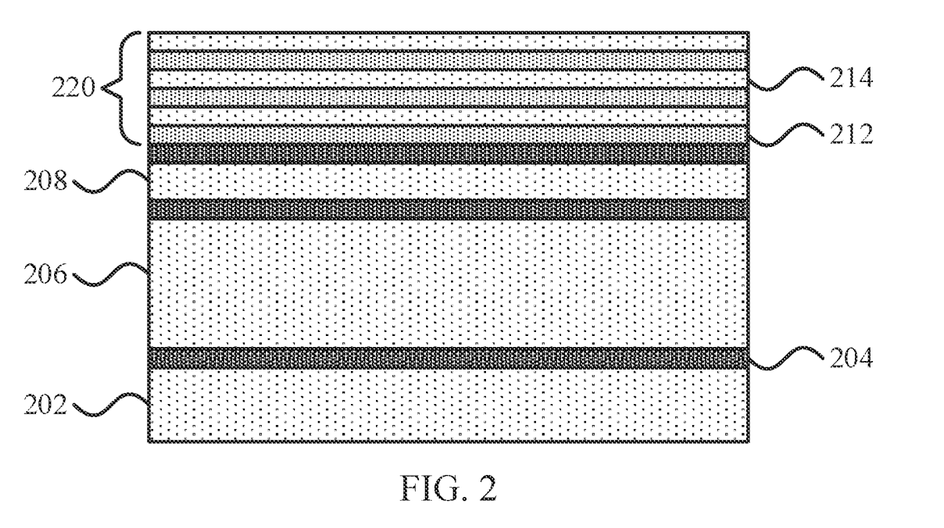
FIG. 2 is a cross-sectional view of a step in the fabrication of an integrated chip with buried power rails, showing the formation of a stack of semiconductor layers on a substrate, including two distinct types of sacrificial layer, in accordance with an embodiment of the present invention.

Referring now to FIG. 2, a cross-sectional view of a step in the fabrication of an integrated chip with buried power rails is shown, along cross-section A. A stack of layers is shown on a substrate 202. The stack includes a set of first sacrificial layers 204, which are positioned between different regions of the stack. A fin region 206 and a base region 208 are formed from semiconductor material. A device stack 220 is formed from a set of alternating layers, including second sacrificial layers 212 and channel layers 214.

The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide.

Similarly, the first sacrificial layers 204, the fin region 206, the base region 208, the second sacrificial layers 212, and the channel layers 214 may be formed from appropriate semiconductor materials. For example, the substrate 202, the fin region 206, the base region 208, may all be formed from silicon. In contrast, the first sacrificial layers 204 and the second sacrificial layers 212 may be formed from silicon germanium, with particular concentrations of germanium. For example, the first sacrificial layers 204 may have a germanium concentration of about 60% (e.g., a value in a range between about 50% and about 65%), while the second sacrificial layers 212 may have a germanium concentration of about 30% (e.g., a value in a range between about 25% and about 35%). These differing concentrations of germanium correspond to different etching rates, such that the sacrificial layers may be selectively etched.

As used herein, the term "selective" in reference to a material removal process denotes that the rate of material removal for a first material is greater than the rate of removal for at least another material of the structure to which the material removal process is being applied. Thus, for a given etch process, the higher germanium concentration of the first sacrificial layers 204 may lead to those layers being etched away first, leaving the silicon and lower-concentration silicon germanium layers relatively intact. Similarly, the lower-concentration silicon germanium layers may be selectively etched away, leaving the remaining silicon layers relatively intact.

To form this stack, any appropriate set of successive deposition processes may be used. In particular, it is specifically contemplated that each successive layer may be epitaxially grown from the previous layer, but it should be understood that other deposition processes may be used instead. As used herein, "epitaxial growth and/or deposition" means the growth of a semiconductor material on a deposition surface of a semiconductor material, in which the semiconductor material being grown has the same crystalline characteristics as the semiconductor material of the deposition surface. For embodiments that use silicon and silicon germanium for the different layers, these materials have similar crystalline structures, and can be epitaxially grown from one another to form the stack.

Figure 3:
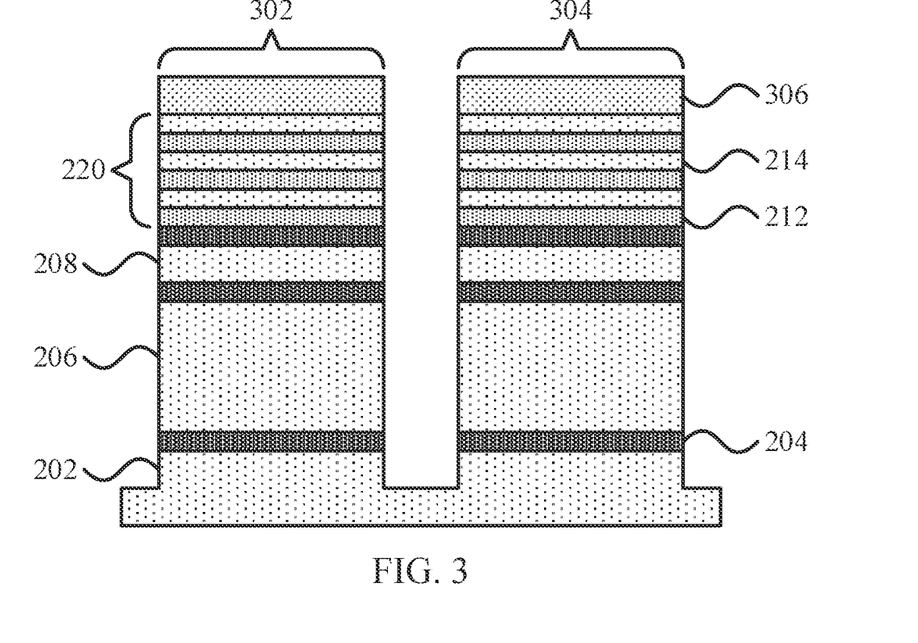
FIG. 3 is a cross-sectional view of a step in the fabrication of an integrated chip with buried power rails, showing the patterning of the stack of layers into distinct regions, which may be used to form n-type devices and p-type devices, in accordance with an embodiment of the present invention.

Referring now to FIG. 3, a cross-sectional view of a step in the fabrication of an integrated chip with buried power rails is shown, along cross-section A. The stack of layers is patterned to form distinct regions, including a first region 302 and a second region 304. This patterning may be performed by forming a mask 306 using, e.g., a photolithographic process, with the mask 306 being formed from any appropriate hardmask material, such as silicon nitride. An anisotropic etch may then be used to etch down into the stack of layers. An anisotropic etch, as the term is used herein, refers to an etching process that removes material in a directional fashion, with a rate of removal being substantially greater in the etch direction than in other directions.

For example, reactive ion etching (RIE) is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. The patterning may be performed with a timed non-selective etch that can etch all of the different materials in the stack. In some cases, the patterning may over-etch the stack, removing some material from the substrate 202.

Figure 4:
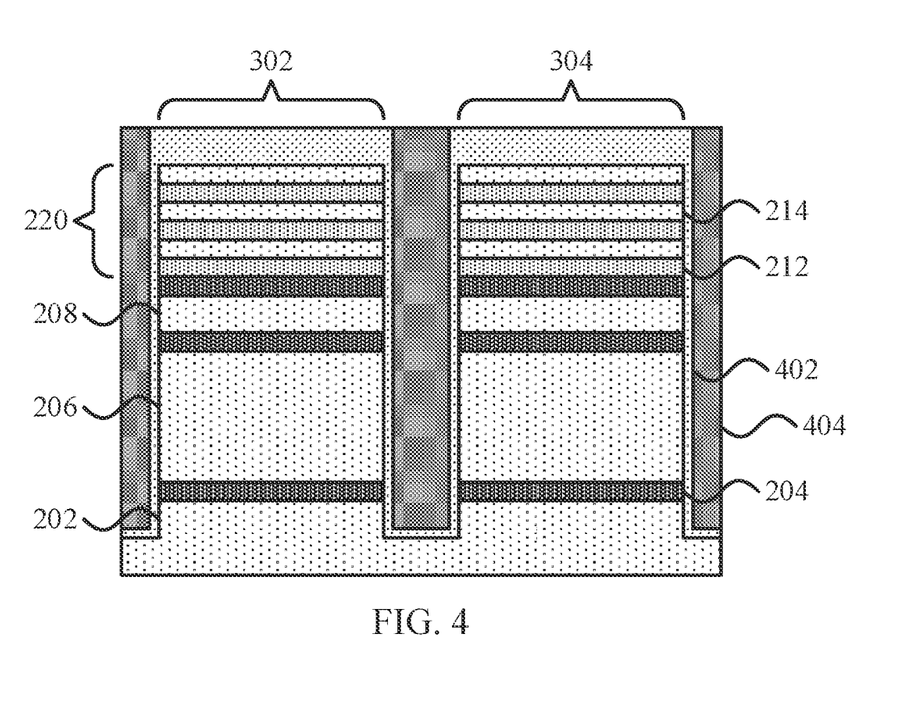
FIG. 4 is a cross-sectional view of a step in the fabrication of an integrated chip with buried power rails, showing the formation of a fill around the patterned stacks, in accordance with an embodiment of the present invention.

Referring now to FIG. 4, a cross-sectional view of a step in the fabrication of an integrated chip with buried power rails is shown, along cross-section A. A liner 402 is conformally formed over first region 302 and the second region 304, forming a protective layer over the sidewalls in these regions. The liner 402 may be formed from any appropriate dielectric material, such as silicon nitride, and may be formed by any appropriate conformal deposition process.

For example, the liner 402 may be formed by any appropriate process including, e.g., chemical vapor deposition (CVD) or atomic layer deposition (ALD). CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use ALD, chemical precursors react with the surface of a material one at a time to deposit a thin film on the surface.

A fill 404 is deposited around the first device region 302 and the second device region 304. The fill 404 may be formed from any appropriate dielectric material, such as silicon dioxide. While it is specifically contemplated that a form of CVD may be used to deposit the fill 404, it should be understood that any appropriate directional or non-directional deposition process may be used instead. The dielectric material may be deposited to a height above the mask 304 and may be polished down to the height of the mask 304, for example using a chemical mechanical planarization process (CMP). CMP is performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 5:
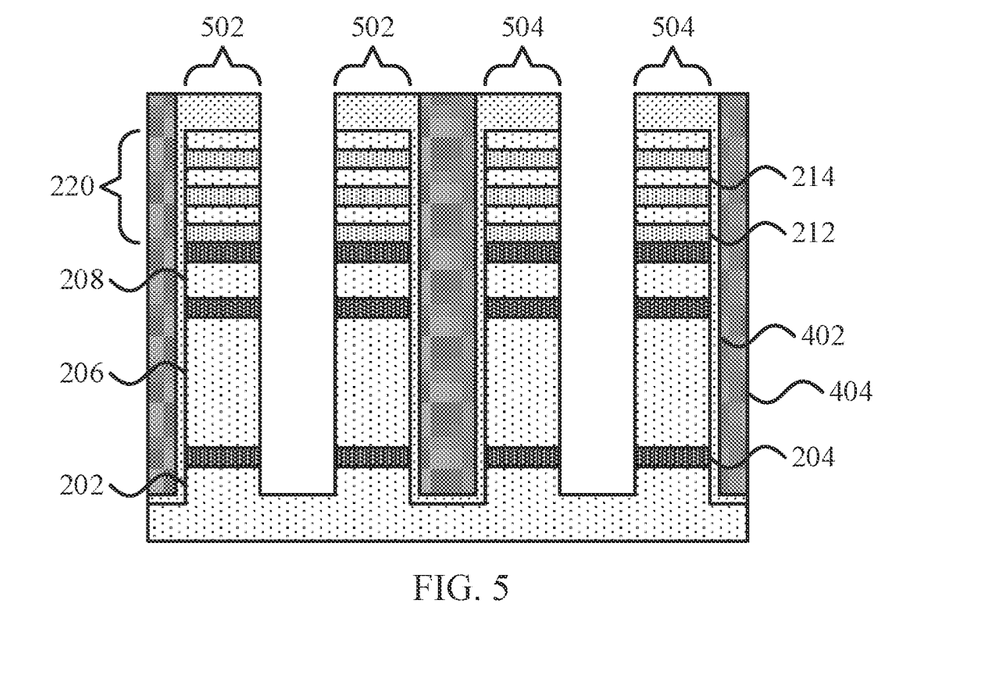
FIG. 5 is a cross-sectional view of a step in the fabrication of an integrated chip with buried power rails, showing the patterning of the device regions into distinct device stacks, in accordance with an embodiment of the present invention.

Referring now to FIG. 5, a cross-sectional view of a step in the fabrication of an integrated chip with buried power rails is shown, along cross-section A. The first region 302 and the second region 304 may be patterned to split the respective stacks into first fins 502 and second fins 504, respectively. Any appropriate patterning process, such as by the formation of a photolithographic mask, followed by a timed anisotropic etch or a series of such etches.

Figure 6:
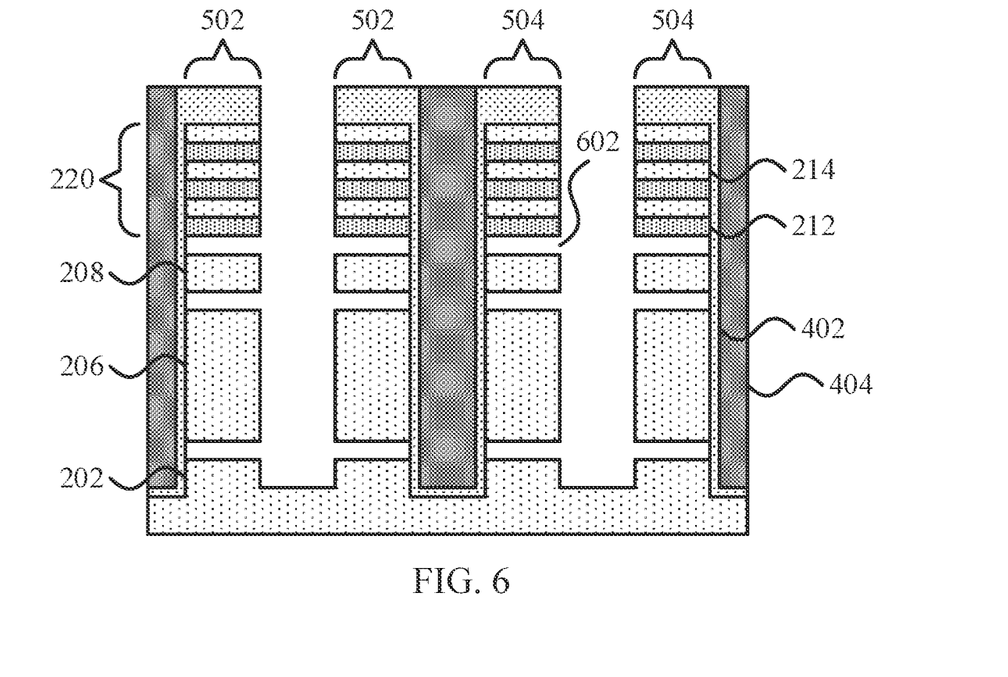
FIG. 6 is a cross-sectional view of a step in the fabrication of an integrated chip with buried power rails, showing the removal of one type of sacrificial semiconductor layer using a selective etch that preserves other semiconductor layers in the device stacks, in accordance with an embodiment of the present invention.

Referring now to FIG. 6, a cross-sectional view of a step in the fabrication of an integrated chip with buried power rails is shown, along cross-section A. The first sacrificial layers 204 are selectively etched away, for example using an isotropic etch that preferentially removes the material of the first sacrificial layers 204. Any appropriate isotropic etch, such as a wet or dry chemical etch, may be used. This leaves gaps 602 in the fins 502 and 504.

Figure 7:
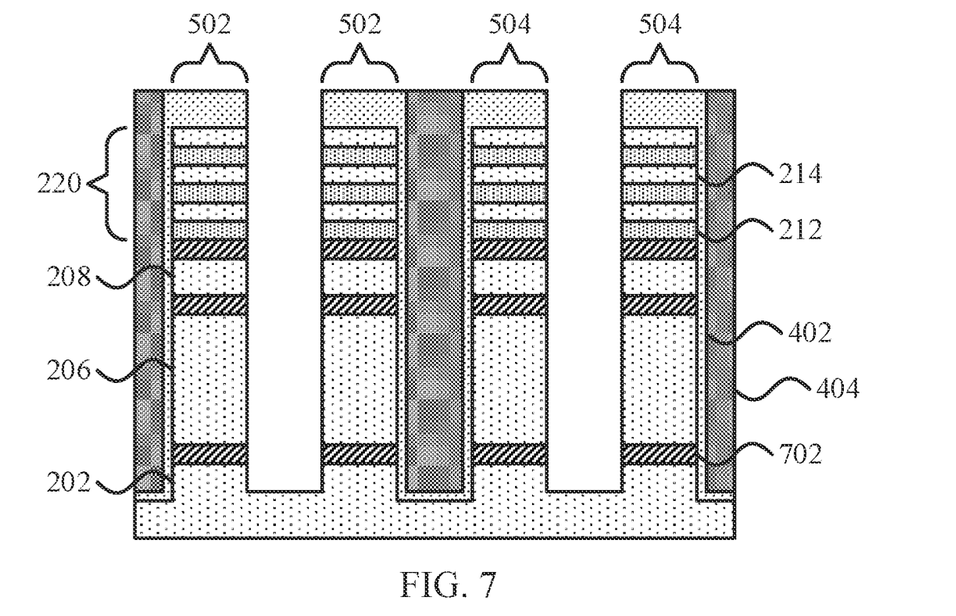
FIG. 7 is a cross-sectional view of a step in the fabrication of an integrated chip with buried power rails, showing the formation of a set of etch stop layers, in the gaps left behind by the selective removal of the sacrificial layers, in accordance with an embodiment of the present invention.

Referring now to FIG. 7, a cross-sectional view of a step in the fabrication of an integrated chip with buried power rails is shown, along cross-section A. The gaps 602 are filled by etch stop layers 702. The etch stop layers 702 may be formed by any appropriate dielectric material that is selectively etchable with respect to the material of the liner 402 and the fill 404. For example, carbon-doped silicon dioxide (SiOC) or silicon carbide may be used for this purpose. The etch stop layers 702 may be formed by a conformal deposition process, such as CVD or ALD, that fills the gaps 602. Excess material on the sidewalls of the fins 502/504 may then be removed using a selective anisotropic etch.

Figure 8:
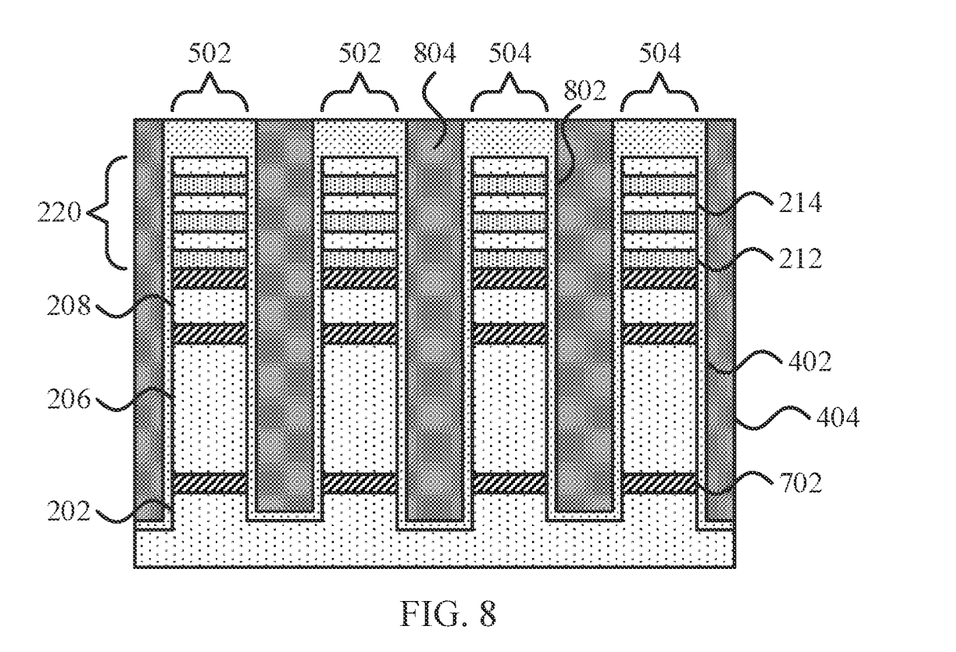
FIG. 8 is a cross-sectional view of a step in the fabrication of an integrated chip with buried power rails, showing the formation of dielectric structures to separate the device stacks, in accordance with an embodiment of the present invention.

Referring now to FIG. 8, a cross-sectional view of a step in the fabrication of an integrated chip with buried power rails is shown, along cross-section A. A liner 802 is conformally formed on exposed sidewalls of the fins 502/504, for example from silicon nitride. The gaps are then filled in with fill 804 using any appropriate deposition process. The fill 804 may be any appropriate dielectric material, such as silicon dioxide.

At this stage, the structures of cross-section A and cross-section B, shown in FIG. 1, diverge. The region indicated by cross-section A is processed to form a gate structure around the channel layers 214, with the second sacrificial layers 212 being etched away. A gate stack is then formed around and between the channel layers 214, including a gate dielectric and a gate conductor, with inner spacers being formed between the channel layers to insulate the gate stack from surrounding materials.

In the region indicated by cross-section B, the second sacrificial layers 212 and the channel layers 214 may be replaced by source/drain regions. In some illustrative embodiments, the second sacrificial layers 212 and the channel layers 214 may be etched away in these regions using an anisotropic etch. The source/drain regions may then be epitaxially grown from remaining channel layer sidewall surfaces in the gate region. The source/drain regions may be doped, whether by in situ doping during growth or through implantation. Thus, source/drain regions for the first fins 502 may be n-type doped, while source/drain regions for the second fins 504 may be p-type doped.

Figure 9:
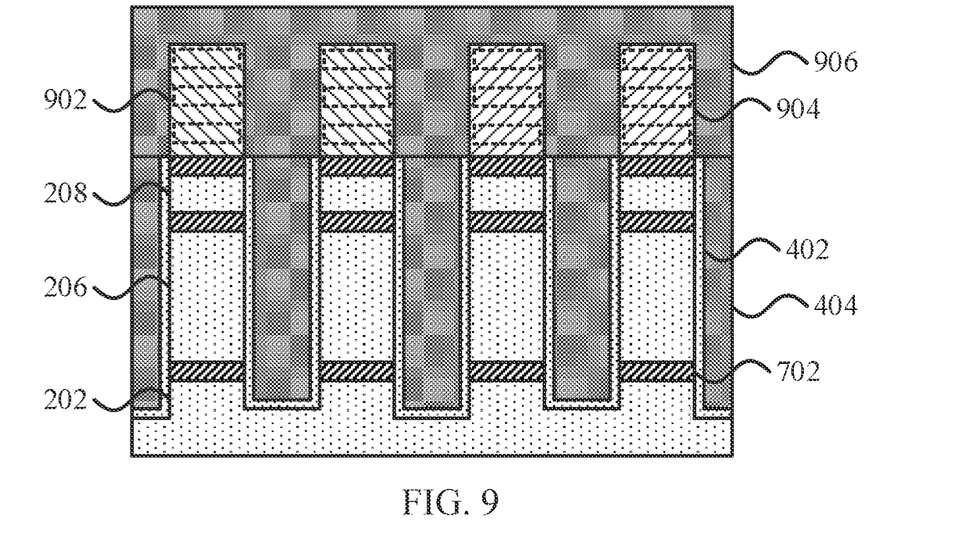
FIG. 9 is a cross-sectional view of a step in the fabrication of an integrated chip with buried power rails, showing the formation of source/drain structures, in accordance with an embodiment of the present invention.

Referring now to FIG. 9, a cross-sectional view of a step in the fabrication of an integrated chip with buried power rails is shown, along cross-section B. The n-type source/drain structures 902 and the p-type source/drain structures 904 are shown. An interlayer dielectric 906 is formed around these structures, to protect them and to electrically insulate them. Also shown are the dashed outlines of the locations of channel layers 214, which still remain on a different plane from that shown (e.g., cross-section B).

Figure 10:
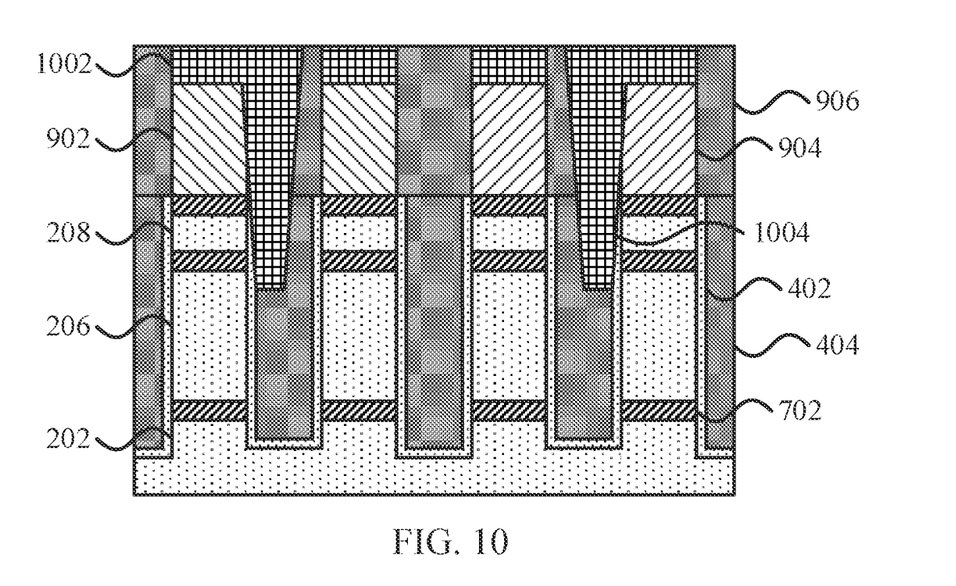
FIG. 10 is a cross-sectional view of a step in the fabrication of an integrated chip with buried power rails, showing the formation of electrical contacts for the source/drain structures that penetrate down into the underlying substrate layer, in accordance with an embodiment of the present invention.

Referring now to FIG. 10, a cross-sectional view of a step in the fabrication of an integrated chip with buried power rails is shown, along cross-section B. Conductive contacts 1002 are formed through the interlayer dielectric 906 to contact the source/drain regions 902 and 904. These contacts may be formed by etching holes in the interlayer dielectric and depositing any conductive material in the holes. The conductive contacts 1002 may be formed from any appropriate conductive material. Some of the contacts may include extensions 1004 that extend down between the fins, to reach to the level of the fin regions 206.

The conductive contacts 1002 may include a silicide liner material, adhesion metal liner, and conductive metal fill. Examples of silicide liner materials include nickel, titanium, nickel platinum, etc. Examples of adhesion liner includes titanium nitride, tantalum nitride, etc., and examples of conductive metal include tungsten, molybdenum, copper, ruthenium, cobalt, and alloys thereof. After metal deposition, a CMP process can be used to remove excessive metals over the ILD 906.

Figure 11:
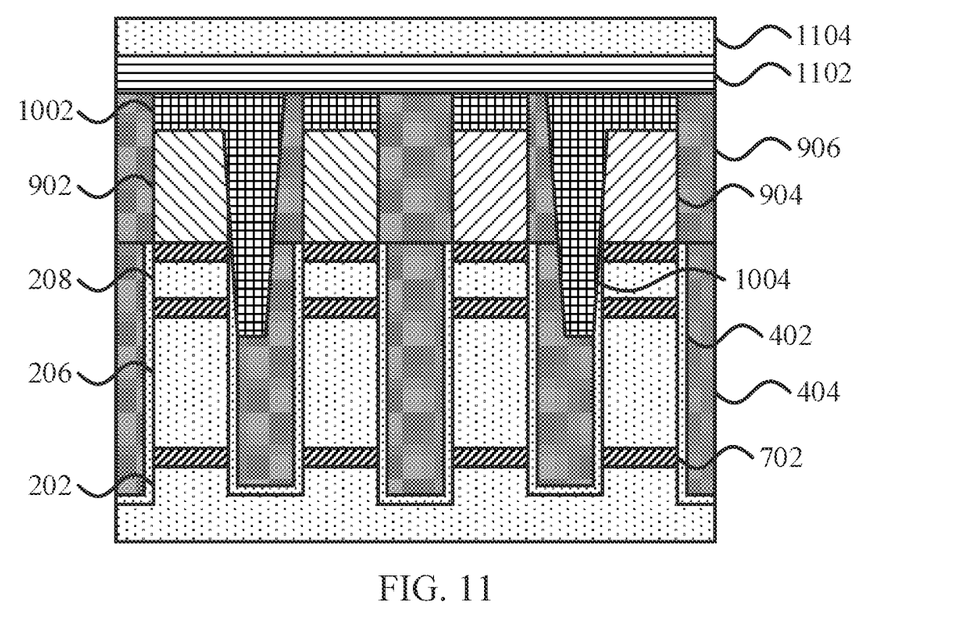
FIG. 11 is a cross-sectional view of a step in the fabrication of an integrated chip with buried power rails, showing the formation of a back-end-of-line layer and a carrier layer, in accordance with an embodiment of the present invention.

Referring now to FIG. 11, a cross-sectional view of a step in the fabrication of an integrated chip with buried power rails is shown, along cross-section B. Back-end-of-line interconnect 1102 is formed on the top surface, in particular providing interconnects to the contacts 1002. The back-end-of-line layer may provide connectivity to other devices on the chip, to off-chip devices, to power or ground rails, and to any other appropriate device. The back-end-of-line layer may have multiple metal/via levels, for example with copper damascene fills. A chip carrier wafer 1104 is attached on the back-end-of-line layer 1102 through a wafer bonding process, such as copper-copper bonding or dielectric-to-dielectric bonding. The chip carrier 1104 may be formed from any appropriate material, such as a silicon substrate, or another wafer with built-in chips on top, and may be used to move and manipulate the chip.

Figure 12:
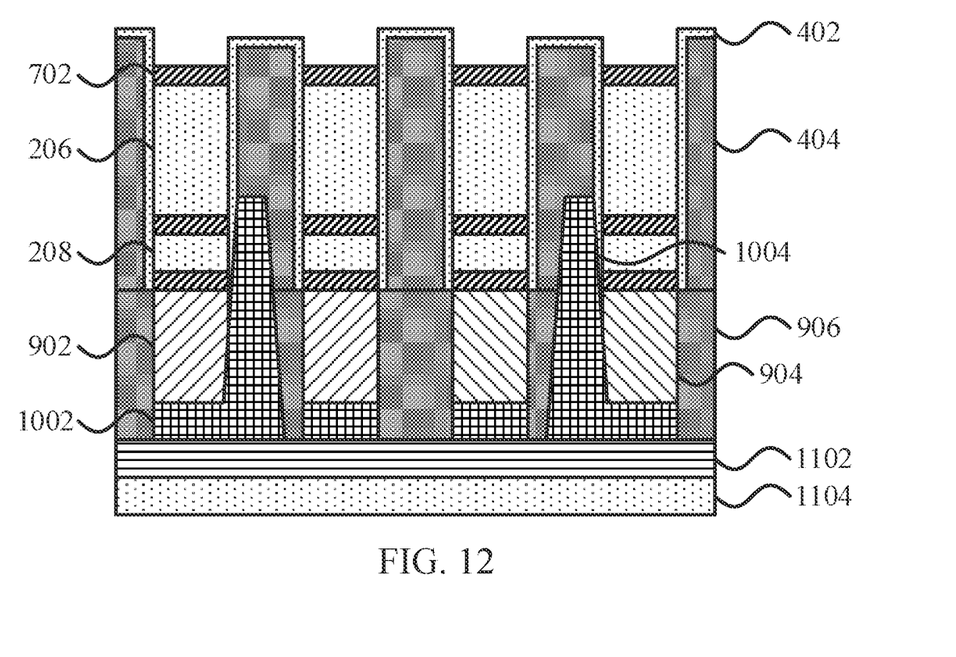
FIG. 12 is a cross-sectional view of a step in the fabrication of an integrated chip with buried power rails, showing the chip having been flipped, with excess substrate material having been removed to expose a bottom etch stop layer, in accordance with an embodiment of the present invention.

Referring now to FIG. 12, a cross-sectional view of a step in the fabrication of an integrated chip with buried power rails is shown, along cross-section B. Using the chip carrier 1104, the chip may be flipped upside-down. The substrate 202 may be etched away, for example using any appropriate combination of wafer grinding, polishing, and etching processes, to expose the liner 402 and etch stop layers 702. The substrate removal process may begin with fast etch processes, such as wafer grinding, to remove most of the wafer. When the substrate is thinned down, for example to a few tens of nanometers or a few hundreds of nanometers, a highly selective silicon etch process may be used to stop the substrate removal process over liner 402 and 702.

Figure 13:
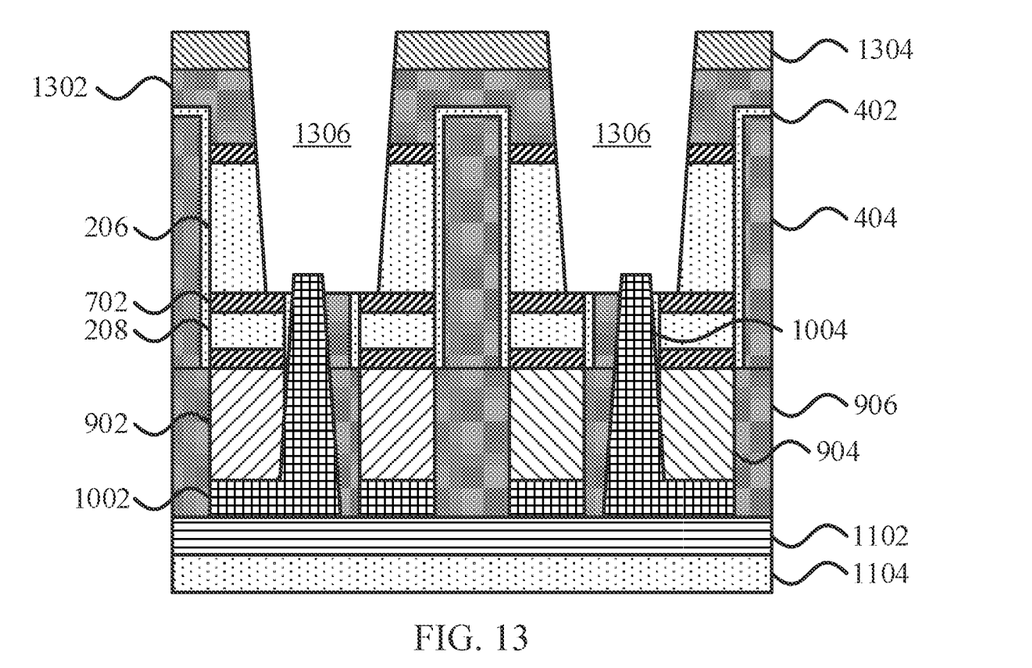
FIG. 13 is a cross-sectional view of a step in the fabrication of an integrated chip with buried power rails, showing the etching of trenches into the substrate, stopping on the etch stop layers to prevent over-etch into the frontside devices, in accordance with an embodiment of the present invention.

Referring now to FIG. 13, a cross-sectional view of a step in the fabrication of an integrated chip with buried power rails is shown, along cross-section B. A backside interlayer dielectric 1302 is deposited over the liner 402, using any appropriate deposition process. For example, CVD may be used to deposit a layer of silicon dioxide. A pattern mask 1304 is then formed over the interlayer dielectric 1302, and may be patterned using any appropriate process. For example, the pattern mask 1304 may be formed from an organic planarizing layer, and may be formed using a photolithographic process. A timed anisotropic etch may then be performed, using the pattern mask 1304 to define trenches in the chip. The anisotropic etch may be non-selective, such that material is removed from the interlayer dielectric 1302, the etch stop layers 702, and the fin 206. The timed anisotropic etch may be timed to reach down into the middle of the fins 206, without reaching to the contact extensions 1004.

Another anisotropic etch may then be performed to remove material from the fins 206 and the fill 404. This etch may be performed until the etch stop layers 702 are exposed underneath the fins 206, thereby preventing accidental shorts to front-end-of-line devices. For example, the etch stop layers 702 may be detected by a chemical sensor that detects when material from the etch stop layers 702 is being removed by the etch, by using a laser that reflects from the etch stop layers 702 when they are exposed, or by an etch process that may be adjusted such that the etch rate of the etch stop layer is very low. The etches may together form buried power rail (or backside power rail) trenches 1306, and expose a portion of the contact extensions 1004.

Figure 14:
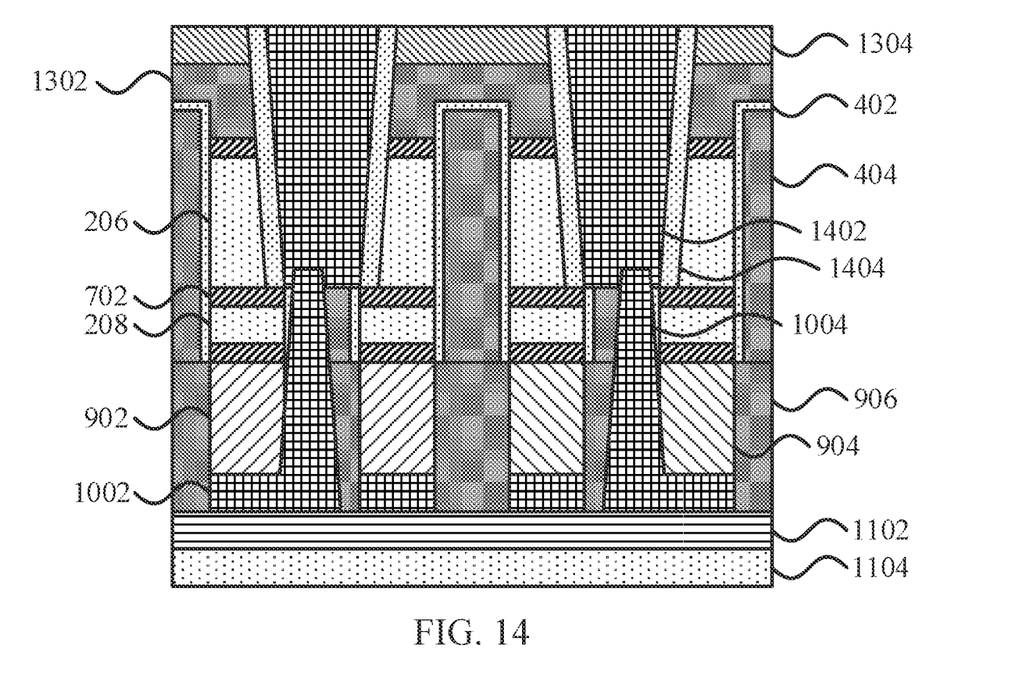
FIG. 14 is a cross-sectional view of a step in the fabrication of an integrated chip with buried power rails, showing the formation of buried power rails in the trenches, in accordance with an embodiment of the present invention.

Referring now to FIG. 14, a cross-sectional view of a step in the fabrication of an integrated chip with buried power rails is shown, along cross-section B. Buried power rails 1402 are formed in the trenches 1306. The buried power rails 1402 may be formed from any appropriate conductive material, and may be formed using any appropriate deposition process. The buried power rails 1402 may include dielectric diffusion barrier 1404, formed before the bulk of the conductive material as a liner on the surfaces of the trenches 1306, to prevent the conductive material from diffusing into the surrounding materials. This dielectric barrier 1404 may be formed from any appropriate dielectric material.

By patterning the trenches 1306 from the backside of the chip, buried power rails 1402 may be formed that are larger in width than would be possible if the space for such rails were created by etching down between the fins, where the width of the rails would be limited by the space between the fins. Additionally, lower-resistance metals may be used, such as copper, and the process is less likely to cause wafer stress or bowing.

Figure 15:
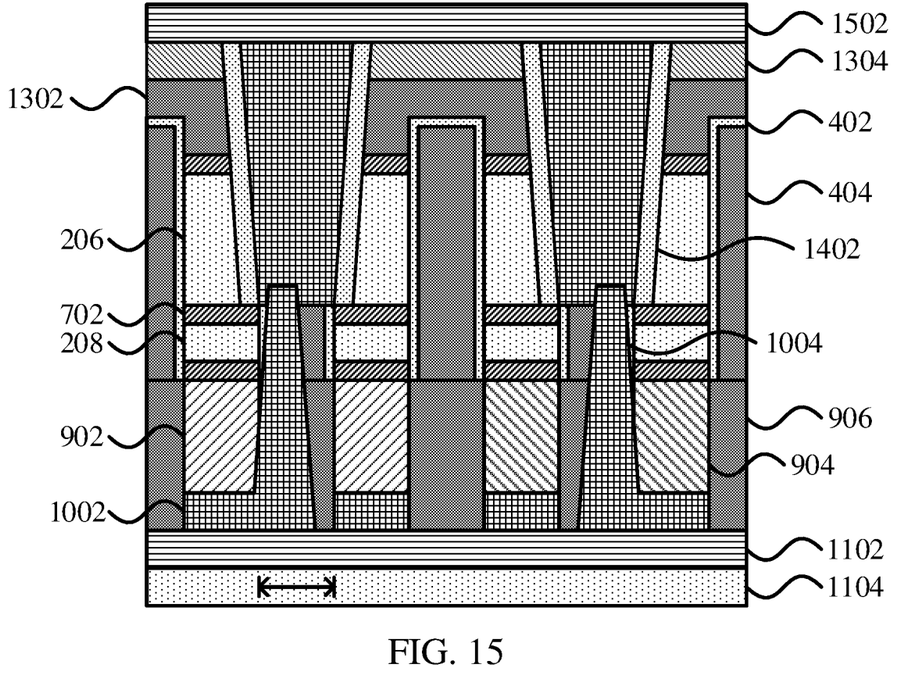
FIG. 15 is a cross-sectional view of a step in the fabrication of an integrated chip with buried power rails, showing the formation of a backside power distribution network to connect to the buried power rails, in accordance with an embodiment of the present invention.

Referring now to FIG. 15, a cross-sectional view of a step in the fabrication of an integrated chip with buried power rails is shown, along cross-section B. A backside power distribution network 1502 may be formed on the chip, providing connectivity to the buried power rails 1402. As with the back-end-of-line layer 1102, the backside power distribution network 1502 may be used to provide connectivity between various devices, power sources, ground, and any other appropriate electrical interconnect or via.

Figure 16:
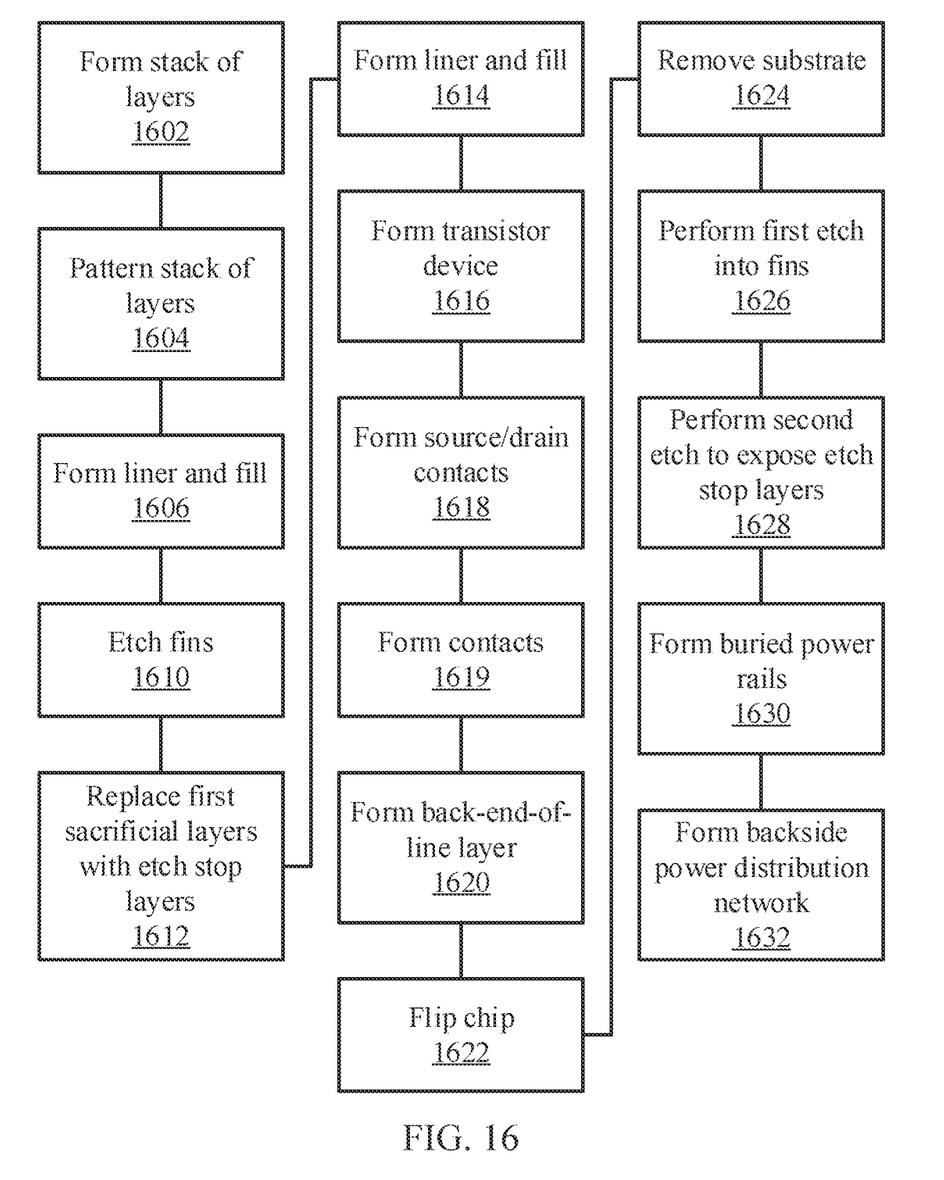
FIG. 16 is a block/flow diagram of a method of fabricating an integrated chip with buried power rails, in accordance with an embodiment of the present invention.

Referring now to FIG. 16, a method of forming an integrated chip with buried power rails is shown. Block 1602 forms the stack of layers on a substrate 202, as shown in FIG. 2. This stack of layers may include a device stack 220, as well as sacrificial layers 204, which may be removed in subsequent processing steps to form etch stop layers. The stack of layers may be formed by successive epitaxial growth processes, with each layer being grown from the material of the previous layer.

Block 1604 patterns the stack of layers to form, e.g., regions 302 and 304. These regions may correspond to, e.g., n-type and p-type devices. Block 1604 may use, for example, a photolithographic process that defines a mask 306, followed by an anisotropic etch, such as RIE. Block 1606 forms a liner 402 over the regions 302 and 304 using a conformal deposition process, and then forms a fill 404 around the liner 402.

Block 1610 etches down into the regions 302 and 304 to form fins 502 and 504, for example using a mask and an anisotropic etch. This exposes sidewall surfaces of the fins 502 and 504. Block 1612 then replaces the first sacrificial layers 204 with etch stop layers 702. The first sacrificial layers 204 may be removed using a selective isotropic etch that preferentially removes the material of the first sacrificial layers 204 by their exposed sidewall surfaces. The etch stop layers 702 may be formed by, e.g., a conformal deposition process, followed by a selective anisotropic etch that removes the deposited material from regions that are not protected by the fins 502 and 504. Block 1614 forms a liner 802 using a conformal deposition process, followed by filling in gaps using a fill 804.

Block 1616 may form any appropriate devices using the device stack 220. This step may include a number of sub-steps, such as etching away second sacrificial layers 212 and forming a gate stack. Block 1618 may form source/drain structures 902/904 on the respective fins 502 and 504, for example by epitaxial growth from remaining channel layers in a gate region. Although it is specifically contemplated that transistors may be formed in this manner, it should be understood that any appropriate device—or no device at all—may be formed at this stage.

Block 1619 forms contact electrodes 1002, including contact extensions 1004 that extend down along the fins. These electrodes 1002 may be formed by etching holes into the interlayer dielectric 906 and fill 404 using an anisotropic etch, followed by any appropriate deposition process for the conductive material. Block 1620 forms a back-end-of-line layer 1102, which may provide electrical connectivity to the electrodes 1002.

Block 1622 flips the chip over, for example using a chip carrier 1104. This exposes the underside of the substrate 202. Block 1624 then removes the substrate 202, for example using any appropriate combination of etching and grinding, to expose the liner 402. Block 1626 performs a first anisotropic etch into the fins 206, for example using a timed anisotropic etch. Block 1628 then performs a second, selective anisotropic etch that stops on etch stop layers 702, to form trenches 1306.

Block 1630 forms buried power rails 1402 in the holes 1306. The formation of the buried power rails 1402 may include a first conformal deposition of a diffusion barrier material, followed by a second deposition of a conductive material that fills the holes. Block 1632 forms a backside power distribution network 1502 that makes contact with the buried power rails 1402, providing electrical connectivity to the buried power rails 1402.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative teams are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of backside power rails (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An integrated chip, comprising:
a frontside device above a base layer, having a channel and source/drain structures;
a buried power rail in the base layer, underneath the frontside device; and
an electrical contact that makes an electrical connection between the buried power rail and the frontside device, wherein the base layer includes:
   a first etch stop layer, which the buried power rail penetrates;
   a first semiconductor layer between the first etch stop layer and the frontside device;
   a second etch stop layer, between the first semiconductor layer and the frontside device;
   a second semiconductor layer between the second etch stop layer and the frontside device; and
   a third etch stop layer between the second semiconductor layer and the frontside device.

2. The integrated chip of claim 1, further comprising a backside power distribution network that includes an interconnect that makes electrical contact with the buried power rail.

3. The integrated chip of claim 1, wherein the buried power rail is wider at a back surface of the base layer than where the electrical contact makes the electrical connection with the buried power rail.

4. An integrated chip, comprising:
a plurality of frontside devices above a base layer, each having a channel and source/drain structures, and having an inter-device distance between an adjacent pair of frontside devices of the plurality of frontside devices;
a buried power rail in the base layer, underneath the pair of frontside devices, having a width that is greater than the inter-device distance; and
an electrical contact that makes an electrical connection between the buried power rail and one of the pair of frontside devices,
wherein the base layer includes:
   a first etch stop layer, which the buried power rail penetrates;
   a first semiconductor layer between the first etch stop layer and the one of the pair of frontside devices;
   a second etch stop layer, between the first semiconductor layer and the one of the pair of frontside devices;
   a second semiconductor layer between the second etch stop layer and the one of the pair of frontside devices; and
   a third etch stop layer between the second semiconductor layer and the one of the pair of frontside devices.

5. The integrated chip of claim 4, further comprising a backside power distribution network that includes an interconnect that makes electrical contact with the buried power rail.

6. The integrated chip of claim 4, wherein the buried power rail is wider at a back surface of the base layer than where the electrical contact makes the electrical connection with the buried power rail.

* * * * *